(12) United States Patent
Groholski et al.

(10) Patent No.: US 6,661,009 B1
(45) Date of Patent: Dec. 9, 2003

(54) APPARATUS FOR TILTING A BEAM SYSTEM (75) Inventors: Alexander Groholski, Salem, MA (US); Riccardo Drainoni, Woburn, MA (US); Michael Tanguay, Kennebunk, ME (US)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 10/159,790

(22) Filed: May 31, 2002

(51) Int. Cl.[7] ............................................... H01J 37/00
(52) U.S. Cl. ..................... 250/310; 250/306; 250/307; 250/251; 250/442.11
(58) Field of Search ............................ 250/310, 306, 250/442.11, 492.2, 307, 251

(56) References Cited

U.S. PATENT DOCUMENTS

| | | | |
|---|---|---|---|
| 4,465,934 A | | 8/1984 | Westerberg et al. ......... 250/398 |
| 4,467,210 A | * | 8/1984 | Sugihara et al. .......... 250/492.2 |
| 4,706,019 A | * | 11/1987 | Richardson .................. 324/751 |
| 4,864,228 A | * | 9/1989 | Richardson .................. 324/751 |
| 5,223,109 A | | 6/1993 | Itoh et al. ............... 204/192.34 |
| 5,229,607 A | * | 7/1993 | Matsui et al. ................ 250/306 |
| 5,541,411 A | | 7/1996 | Lindquist et al. ............ 250/309 |
| 5,576,542 A | | 11/1996 | Kaga ........................... 250/310 |
| 5,869,833 A | * | 2/1999 | Richardson et al. ......... 250/310 |
| 6,039,000 A | | 3/2000 | Libby et al. .............. 118/723 E |
| 6,211,518 B1 | * | 4/2001 | Richardson et al. ........ 250/310 |

FOREIGN PATENT DOCUMENTS

| | | | | |
|---|---|---|---|---|
| JP | 63055958 A | 3/1988 | ........... H01L/21/88 |
| JP | 02035725 A | 2/1990 | ......... H01L/21/302 |
| JP | 04180621 A | 6/1992 | ......... H01L/21/302 |
| JP | 04186831 A | 7/1992 | ......... H01L/21/302 |
| JP | 06029251 A | 2/1994 | ......... H01L/21/302 |
| JP | 07078737 A | 3/1995 | ........... H01L/21/27 |

OTHER PUBLICATIONS

Esashi et al. Laser Applications for Micromachining, AIP Conference Proceedings, vol. 369, Issue 1, pp. 1268–1273, May 1, 1996.

Sawaragi, H., et al., "Performance of a Focused–Ion–Beam Implanter with Tilt—Writting Function," *Jpn J Appl Phys Part 1*, vol. 28, No. (1989) pp. 2095–2098.

* cited by examiner

*Primary Examiner*—John R. Lee
*Assistant Examiner*—Paul M. Gurzo
(74) *Attorney, Agent, or Firm*—Michael O. Scheinberg (57) ABSTRACT

The present invention provides a column tilt apparatus and method for providing an off-normal angle of incidence of a beam in a scanned beam system onto a substrate passing through the eucentric point that is electro-mechanically adjustable during operation while maintaining vacuum integrity of the column and work chamber, and without introducing significant vibrations.

23 Claims, 8 Drawing Sheets

APPARATUS FOR TILTING A BEAM SYSTEM

TECHNICAL FIELD OF THE INVENTION

The present invention relates to the field of scanned beam systems, and in particular, to a method and apparatus for tilting a beam column.

BACKGROUND OF THE INVENTION

Scanned beam microscopy systems, including charged particle beam systems such as electron beam and focused ion beam (FIB) systems, are widely used in characterization or treatment of materials on a microscopic scale. For example, focused ion beam systems are used in manufacturing operations because of their ability to image, etch, mill, deposit and analyze with great precision. Ion columns in FIB systems using gallium liquid metal ion sources (LMIS), for example, can provide five to seven nanometer lateral imaging resolution.

The beam of a scanning beam system typically scans the surface of a target specimen in a raster pattern. This raster pattern may be used to produce an image of the surface of the target. When the scanned beam strikes the target, particles or photons are emitted from the immediate vicinity of beam impact. A portion of these emissions are measured or collected using a suitable detector or collector that produces an output signal indicative of the intensity of the emission. This output signal is then processed to produce an observable image displayed on a conventional video monitor.

A typical application of scanning beam systems is for analysis and treatment of integrated circuits (IC). In this application, a focused ion beam is used to produce an image of the circuit. This image is then used in conjunction with circuit layout information to navigate the ion beam over the surface of the circuit to locate a specific element or feature of interest. When the beam is scanned to the local area of interest, the beam current can be increased to cut into the circuit die and expose circuit features buried in layers. The FIB system can then alter the exposed circuit by cutting conductive traces to break electrical connections or by depositing conductive material to provide new electrical connections. This etching or deposition is caused by a physical or chemical reaction of the beam ions with the specimen and occurs at a rate that is largely dependent upon the constituent ions of the beam, the presence and type of etch enhancing or deposition precursor gases, and the beam current.

Although the typical focused beam system configuration provides a beam that impinges normal to the substrate, focused beam systems may be used in tilt orientations, in which the beam impinges at an off-normal angle of incidence with respect to the plane of the substrate to perform ion beam milling or electron beam viewing at a specified angle. Although this could be accomplished by tilting the stage that contains the working piece to be viewed or etched, there is difficulty in maintaining coincidence between the center point of beam impact and the axis of stage rotation for all desired angles of incidence.

Alternatively, a change in angle of incidence could be obtained by tilting the beam column about an axis of rotation passing through the working piece at the desired center point of beam impact. But prior art methods do not provide a satisfactory way to provide a change in column tilt angle without interrupting system operation. Prior art methods for providing column tilt to produce an off-normal angle of incidence include the use of fixed tapered spacers in conjunction with vacuum seals to set the incidence angle of the beam. To expose the working piece to successive incidence angles, one must iteratively change the spacers used to set the angle of column tilt. Changing the tapered spacers required exposing the sample chamber, thereby requiring additional time to evacuate the chamber and restart and stabilize the emitter after the tilt angle is changed. An alternative prior art method employs a bellows that purportedly enables the system to remain sealed while the column is mechanically tilted, but the change in tilt angle must be performed manually and is difficult to rapidly set to a precise angle of tilt.

It is desirable to have the beam remain focused at the same point on the work piece throughout a range of column tilt angles. This can be achieved by tilting the beam about the point at which the beam is focused to maintain a constant "eucentric point." A "eucentric point" is defined as an arbitrary point through which the beam passes when it is not being deflected and that is a specified distance from the axis of beam deflection. The eucentric point is preferably chosen to coincide with the center point of beam impact and the eucentric point preferably stays at the same location in space for all angles of column tilt. Prior art methods do not provide a satisfactory method of achieving this constant eucentric point. Further, prior art methods do not provide a satisfactory way to provide a change in tilt angle without interrupting system operation. It would therefore be desirable to provide a system and method that enables column tilt over a range of tilt angles during system operation while maintaining a constant eucentric point that overcomes prior art limitations.

SUMMARY OF THE INVENTION

The present invention overcomes prior art limitations by providing a method and apparatus for automated adjustment of the tilt angle of a beam column during operation of a scanned beam system over a continuous angular sector, while maintaining a constant eucentric point, maintaining vacuum integrity of the column and work chamber, and without introducing significant vibrations.

According to the present invention, a beam column can be driven electro-mechanically throughout a range of angular displacement to enable precise control of the angle of tilt while maintaining a constant eucentric point. The electro-mechanical drive system can be controlled by computer to provide a desired sequence of angular displacements through which the column is tilted during operation of the beam system. Air bearing support is provided to minimize friction and vibration in the system and a unique bellows is employed to maintain a vacuum or low-pressure environment as the column is tilted The foregoing has outlined rather broadly the features and technical advantages of the present invention in order that the detailed description of the invention that follows may be better understood. Additional features and advantages of the invention will be described hereinafter. It should be appreciated by those skilled in the art that the disclosure provided herein may be readily utilized as a basis for modifying or designing other structures for carrying out the same purposes of the present invention. Persons of skill in the art will realize that such equivalent constructions do not depart from the spirit and scope of the invention as set forth in the appended claims, and that not all objects attainable by the present invention need be attained in each and every embodiment that falls within the scope of the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE PREFERRED EMBODIMENTS

The present invention provides a method and apparatus for automated adjustment of the tilt angle of a beam column during operation of a scanned beam system over a continuous angular sector, while maintaining a constant eucentric point, maintaining vacuum integrity of the column and work chamber, and without introducing significant vibrations.

The present invention will be discussed in the context of use in a focused ion beam system for demonstrative purposes. However, it will be understood that the methods of the present invention may also be employed in other scanned systems, such as electron beam systems including scanning electron microscopes and scanning transmission electron microscopes.

Figure 1:
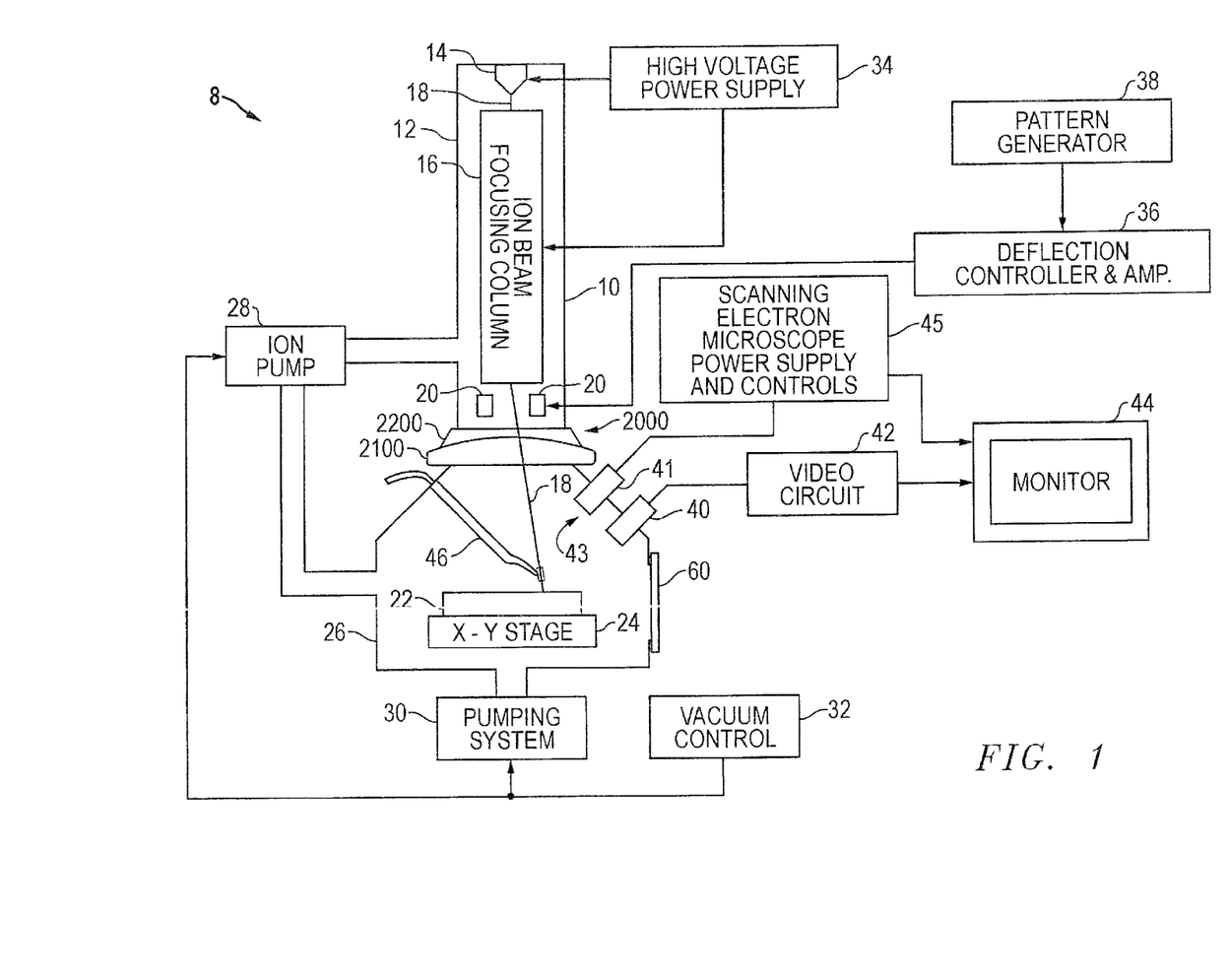
FIG. 1 is a diagram of a focused ion beam system.

In FIG. 1, a focused ion beam system 8 includes an evacuated envelope 10 having an upper neck portion 12 within which are located a liquid metal ion source 14 and a focusing column 16 including extractor electrodes and an electrostatic optical system. Ion beam 18 passes from source 14 through column 16 and between electrostatic deflection mechanism schematically indicated at 20 toward specimen 22, which comprises, for example, a semiconductor device positioned on movable X-Y stage 24 within lower chamber 26. An ion pump 28 is employed for evacuating neck portion 12. The chamber 26 is evacuated with turbo-molecular and mechanical pumping system 30 under the control of vacuum controller 32. The vacuum system provides within chamber 26 a vacuum of between approximately $1\times10^{-7}$ Torr and $5\times10^{-4}$ Torr. If an etch-assisting or an etch-retarding gas is used, the chamber background pressure is typically about $1\times10^{-5}$ Torr.

High voltage power supply 34 is connected to liquid metal ion source 14 as well as to appropriate electrodes in focusing column 16 for forming an approximately 1 keV to 60 keV ion beam 18 and directing the same downwardly. Deflection controller and amplifier 36, operated in accordance with a prescribed pattern provided by pattern generator 38, is coupled to deflection plates 20 whereby beam 18 may be controlled to trace out a corresponding pattern on the upper surface of specimen 22. In some systems the deflection plates are placed before the final lens, as is well known in the art.

The source 14 typically provides a metal ion beam of gallium, although other ion sources, such as a multi-cusp or other plasma ion source, can be used. The source typically is capable of being focused into a sub-one-tenth micron wide beam at specimen 22 for either modifying the surface 22 by ion milling, enhanced etch, material deposition, or for the purpose of imaging the surface 22. A charged particle multiplier 40 used for detecting secondary ion or electron emission for imaging is connected to video circuit and amplifier 42, the latter supplying drive for video monitor 44 also receiving deflection signals from controller 36. The location of charged particle multiplier 40 within chamber 26 can vary in different embodiments. For example, a preferred charged particle multiplier 40 can be coaxial with the ion beam and include a hole for allowing the ion beam to pass. A scanning electron microscope 41, along with its power supply and controls 45, are optionally provided with the FIB system 8.

A fluid delivery system 46 optionally extends into lower chamber 26 for introducing and directing a gaseous vapor toward sample 22. U.S. Pat. No. 5,851,413 to Casella et al. for "Gas Delivery Systems For Particle Beam Processing," assigned to the assignee of the present invention, describes a suitable fluid delivery system 46.

A door 60 is opened for inserting specimen 22 on stage 24 which may be heated or cooled and also for servicing a reservoir if one is present. The door is interlocked so that it cannot be opened if the system is under vacuum. The high voltage power supply-provides an appropriate acceleration voltage to electrodes in ion beam column 16 for energizing and focusing ion beam 18. When it strikes specimen 22, material is sputtered, that is physically ejected, from the sample. Focused ion beam systems are commercially available, for example, from FEI Company, Hillsboro, Oregon, the assignee of the present application. Signals applied to deflection controller and amplifier 36 cause the focused ion beam to move within a target area to be imaged or milled according to a pattern controlled by pattern generator 38.

Figure 2:
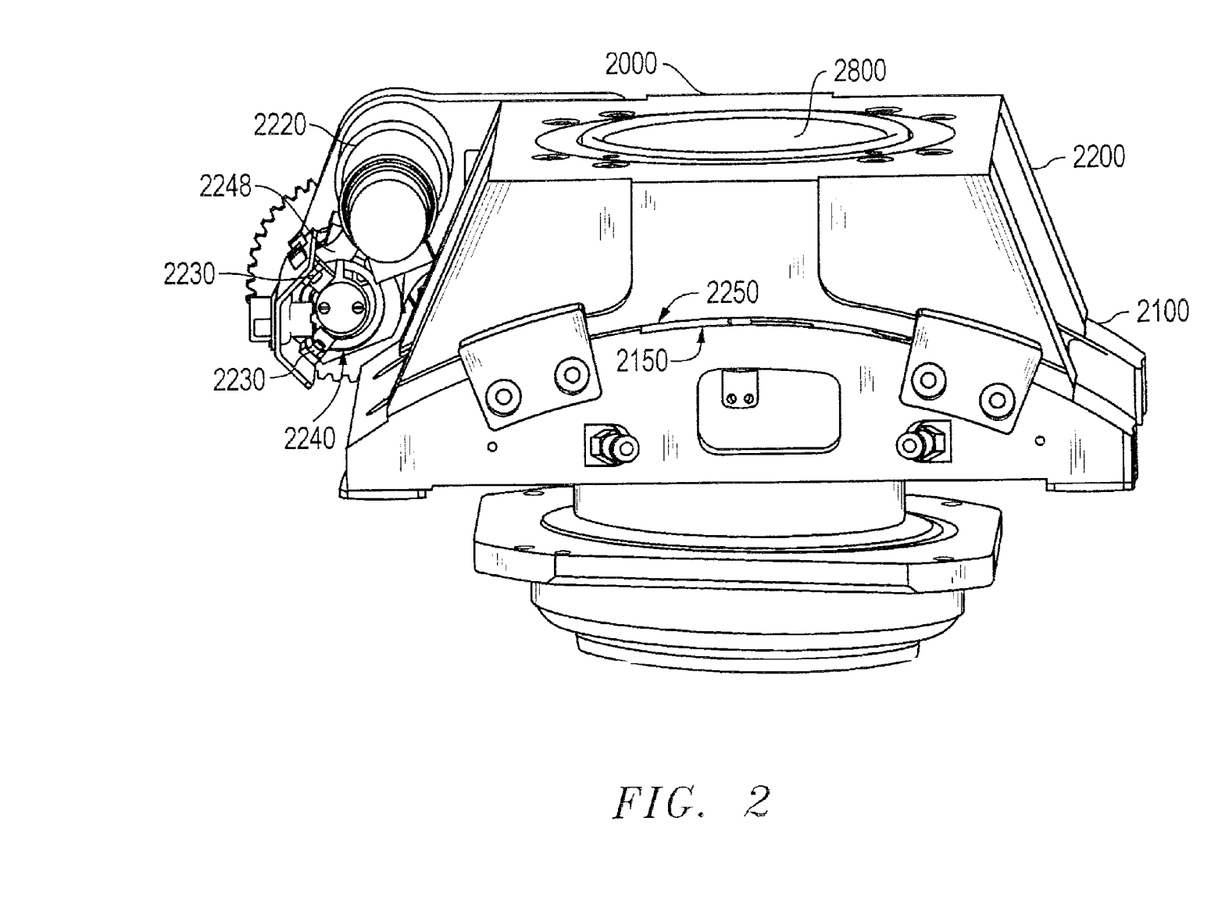
FIG. 2 is a perspective view of an embodiment of a column tilt apparatus of the present invention.

A preferred embodiment of the present invention is shown in perspective view in FIG. 2. A column tilt apparatus 2000 comprises a first assembly 2100 and a second assembly 2200. First assembly 2100 remains stationary, whereas second assembly 2200 moves with respect to first assembly 2100. A beam column is inserted into a cylindrical bore 2800 that passes through both subassemblies to enable the beam generated by the beam column to propagate to a substrate located below column tilt apparatus 2000. The beam column is mounted to assembly 2200 so that the beam column moves with assembly 2200. FIG. 1 shows schematically the relationship between first assembly 2100, lower chamber 26, FIB column housing 12, and second assembly 2200. As will be described more fully below, cylindrical bore 2800 is the interior of a bellows assembly that has an upper portion mounted to movable subassembly 2200 and a lower portion that is stationary.

Figures 3A, 3B:
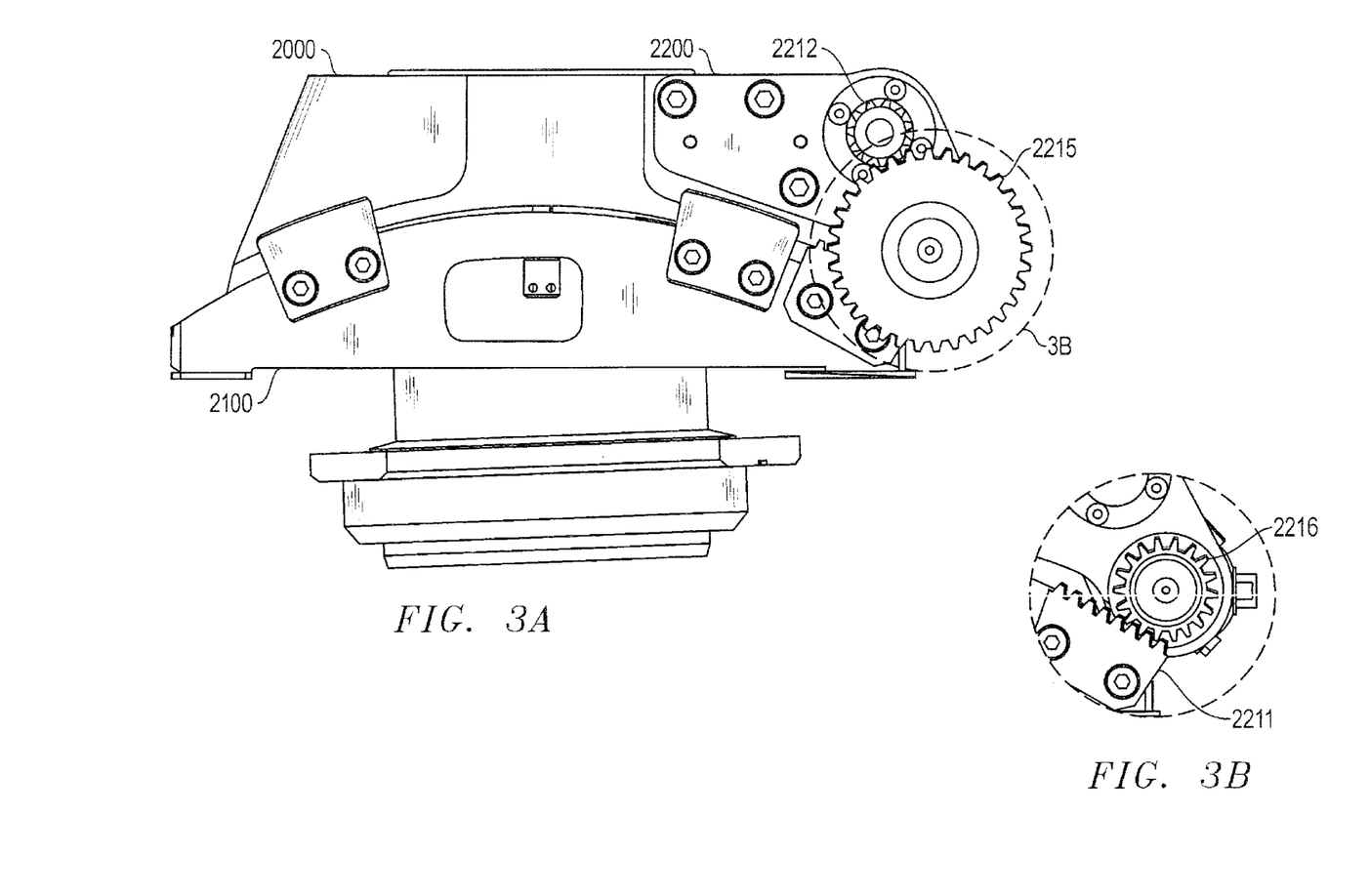
FIG. 3A is a side view of the column tilt apparatus shown in FIG. 2.
FIG. 3B is a detail view of meshed gears employed in an embodiment of the present invention.

Attached to assembly 2200 is a motor 2220 and a gear unit 2240. A side view of column tilt apparatus 2000 is shown in FIG. 3A. Motor 2220 is attached to a gear 2212. Gear 2212 is enmeshed with a gear 2215. Gear 2215 is attached to a smaller gear 2216, as shown in FIG. 3B, and is also attached to gear unit 2240. As shown in FIG. 3B, gear 2216 is enmeshed with a gear segment 2111 that is attached to stationary assembly 2100.

Figure 4:
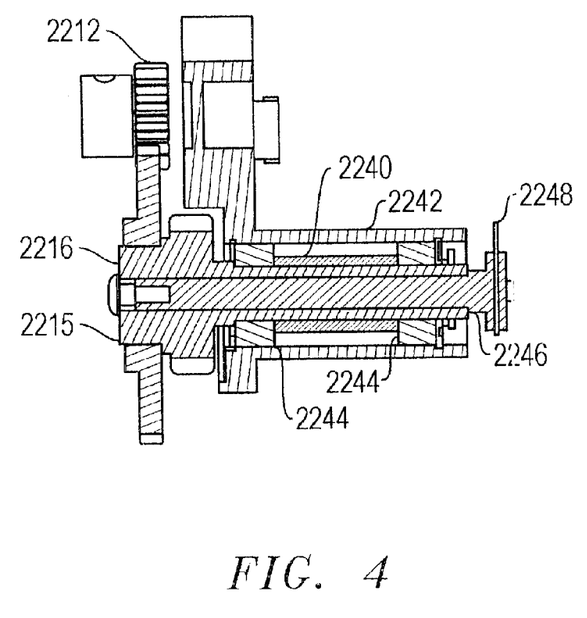
FIG. 4 is a cross-sectional view of a gear unit employed in an embodiment of the present invention.

A side view of gear unit 2240 is shown in FIG. 4. Gear unit housing 2242 is attached to, and moves with, assembly 2200. Passing through gear unit housing 2242, and free to rotate there within against ball bearings 2244, is a shaft 2246 to which gears 2215 and 2216 are attached at one end. When motor 2220 is caused to rotate, gear 2212 rotates. The rotation of gear 2212 causes gear 2215 and 2216 to also rotate. Since gear 2216 is enmeshed with gear segment 2111, which is attached to stationary assembly 2100, assembly 2200 is forced to move.

Referring again to FIG. 2, assembly 2100 and assembly 2200 each have facing surfaces 2150 and 2250, respectively, that exhibit a radius of curvature that is the same as the radius of curvature exhibited by gear segment 2111, shown in FIG. 3B, so that the angular rotation of gear 2216 defines the angular displacement of assembly 2200. Since, the beam column is attached to assembly 2200, it moves with assembly 2200, and thus, the angular rotation of the motor transmitted to gear 2216 controls and defines the angular displacement of the beam column. The radius of curvature of the surfaces 2150 and 2250 are preferably such that the angular displacement of assembly 2200 causes the beam to rotate about an axis passing through the eucentric point of the beam system.

Motor 2220 is controlled by electrical signals that correspond to a desired angular displacement of the beam column. Thus, while the beam system is in operation, the angular displacement of the beam column can be adjusted by a controlled changed in the electrical signals driving motor 2220. When gears 2215 and 2216 are caused to rotate, shaft 2246 is also thereby caused to rotate. At the end of shaft 2246 that is opposite to the end that gears 2215 and 2216 are mounted, is mounted a flag 2248, shown in FIG. 4. Flag 2248 rotates with shaft 2246. Referring to FIG. 2, optical sensors 2250, preferably infrared sensors, are mounted in a position such that flag 2248 will obstruct an optical path of sensors 2250 when assembly 2200 is rotated to an extreme of angular displacement clockwise or counterclockwise. When obstruction of the optical path occurs, a sensor 2250 generates an electrical signal that causes motor 2220 to stop rotating, thereby causing assembly 2200, and consequently, the beam column, to stop its angular displacement. Moreover, in conjunction with optical gratings, a stepper motor, and encoder, the stepper motor can be controlled to produce angular displacement with a resolution 1/30,000 of a degree or better; subject to the mechanical tolerances that can be minimized to the limits of machining precision.

Friction between surfaces 2150 and 2250 is preferably eliminated, or at least minimized, by an air bearing; that is, pressurized air is applied to cause assembly 2200 to be lifted above assembly 2100 by a small amount, e.g., 10 microns, and even less than 2 micrometers, to prevent frictional contact between surfaces 2150 and 2250 and further to minimize vibration. Persons of ordinary skill in the art will recognize other methods for reducing vibration and friction between assemblies 2100 and 2200, given the disclosure herein.

Figure 5:
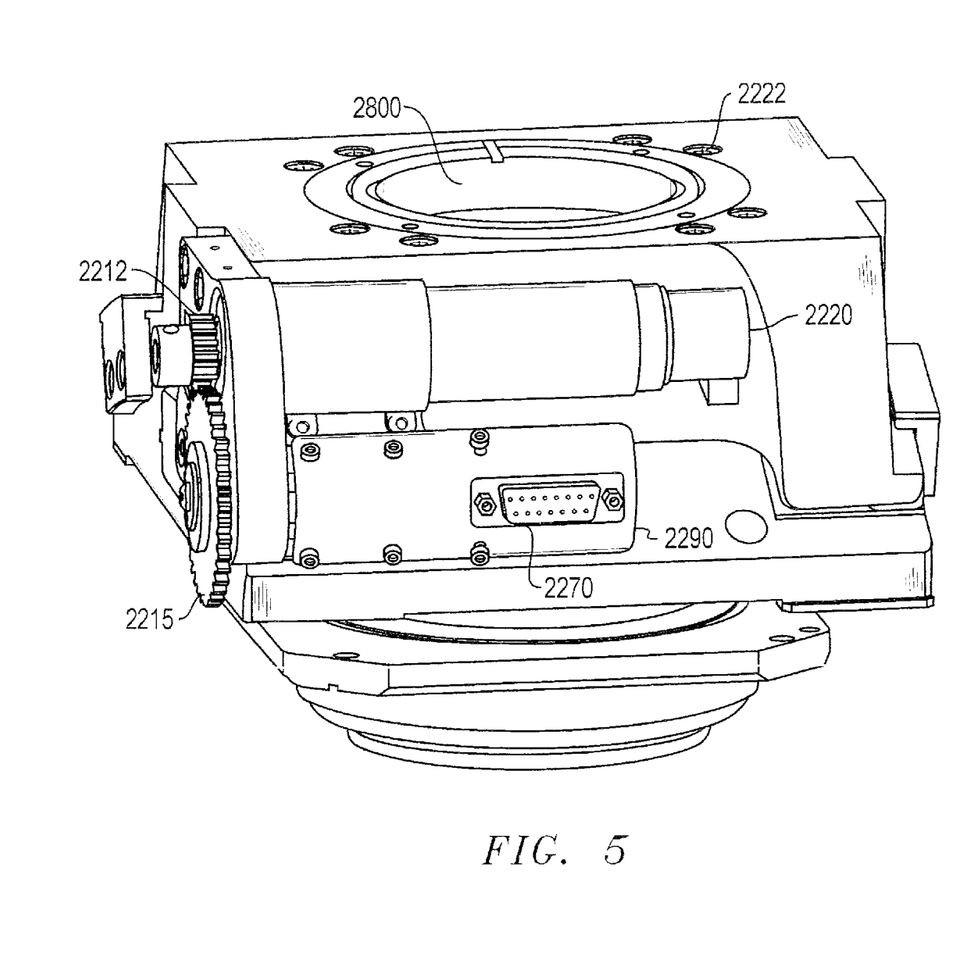
FIG. 5 is a perspective view of an embodiment of a column tilt apparatus of the present invention.

FIG. 5 is another perspective view of column tilt apparatus 2000 showing motor 2220 connected to gear 2212, which is enmeshed with gear 2215. Gear unit 2240 is located behind a cover plate 2290 that provides support for electrical connections to electronics assembly 2270. Electronics assembly 2270 enables control signals to be transmitted to motor 2220 and sensor signals to be received from sensors 2250.

Figure 6:
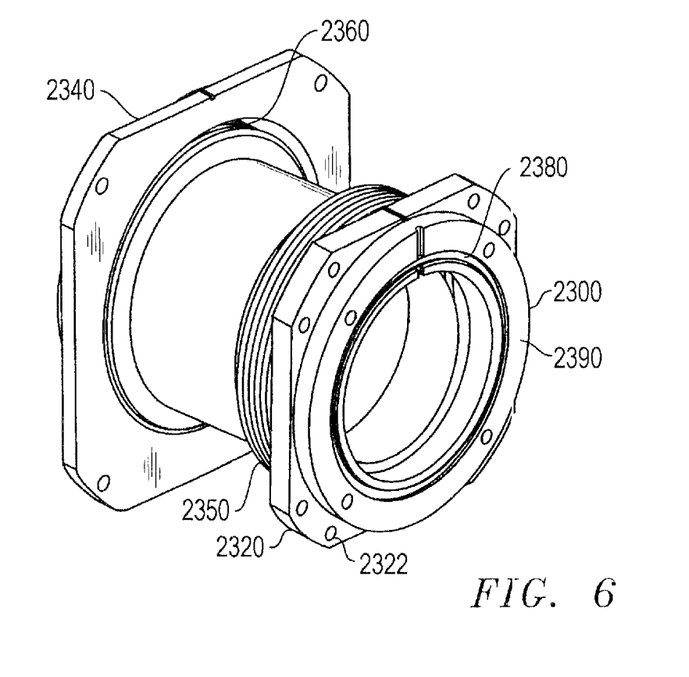
FIG. 6 is a perspective view of a bellows assembly.

Inserted and mounted within cylindrical bore 2800 is a bellows that enables motion between assemblies 2100 and 2200 While maintaining vacuum in the focused beam system. A perspective view of a bellows assembly 2300 is shown in FIG. 6. A first mounting flange 2320 is provided for mounting bellows assembly 2300 to second assembly 2200 with holes 2322 aligned with the holes 2222 shown in FIG. 5 for securing bellows 2300 to assembly 2200 with bolts or other suitable mechanism. A second mounting flange 2340 is also provided for mounting bellows assembly 2300 to a fixed structural support assembly to which subassembly 2100 is mounted. Thus, an upper portion of the bellows assembly moves with subassembly 2200 and the lower portion of the bellows assembly remains stationary.

Also partially shown in FIG. 6 are a first bellows subassembly 2350 and second bellows subassembly 2360. These subassemblies are shown more fully in FIG. 7, which provides a cross-section view of bellows assembly 2300. First and second bellows subassemblies 2350 and 2360 are preferably formed of a plurality of flat cylindrical rings each formed of stainless steel of nominal thickness 0.05 inches with an inner diameter of about 3.2 inches and an outer diameter of about 4.2 inches. To form the bellows, a first and second adjacent ring are welded at their inner diameter. The second and a third adjacent ring are welded at their outer diameter. The third and a fourth adjacent ring are welded at their inner diameter, and so forth, to form the accordion-like structures, 2350 and 2360, shown in FIG. 7.

Figure 7:
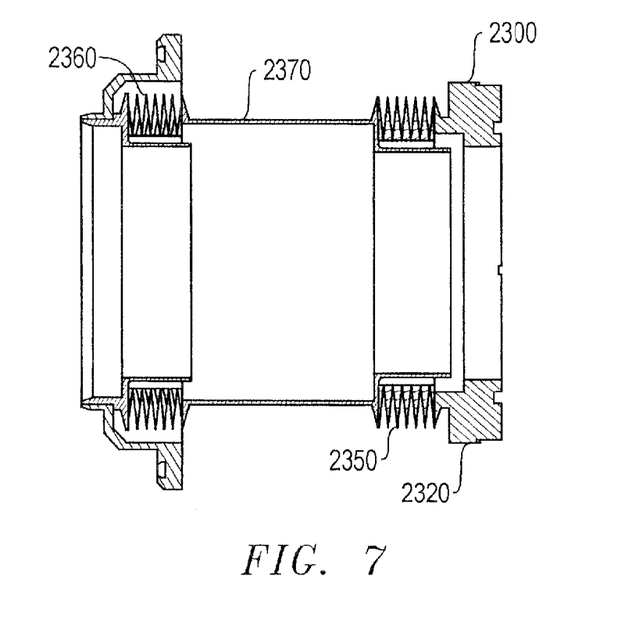
FIG. 7 is cross-section view of a bellows assembly.

The upper end of bellows subassembly 2350 is welded to flange structure 2320 and the lower end of bellows subassembly 2350 is welded to a cylindrical structure 2370. Similarly, the lower end of bellows subassembly 2360 is welded to flange structure 2340 and the upper end of bellows subassembly 2360 is welded to cylindrical structure 2370. When subassembly 2200 is caused to move with respect to subassembly 2100, bellows subassemblies 2350 and 2360 expand and contract in accordion-like manner. Cylindrical structure 2370, which may be formed of thin steel, prevents any particulate matter from entering into its interior, thereby preventing contamination within the system.

O-rings are also employed to maintain a vacuum seal between the bellows assembly and the beam column on one side and the system vacuum chamber on the other side. In particular, an O-ring groove 2380 shown in FIG. 6 is provided to form a pressure seal at the mating surfaces of flange 2390, also shown in FIG. 6, and a mating flange of the beam column (not shown). This prevents leakage between the low pressure region interior to bellows assembly 2300 and the environment exterior to the tilt apparatus. A similar O-ring (not shown) forms a seal between flange 2340 and the system vacuum chamber. As previously noted, the end of the beam column through which the beam is emitted is inserted into the central bore of the bellows assembly and vacuum sealed with the bellows, enabling the beam to travel in the vacuum to the work piece. The beam column can then be tilted through an angular displacement while maintaining the vacuum seal. The bellows described herein can withstand 10,000 full stroke cycles, although full stroke cycles are not used in practice. As such, the bellows can exceed the life of the beam system in which it is employed. Alternatively, the bellows can be replaced in less than two hours by service personnel.

The bellows 2300 can be constructed to provide at least 5 degrees and preferably 10 degrees of angular displacement of assembly 2200. This is advantageous when the contour of a feature etched into a substrate is important. For example, during the fabrication of integrated circuits, it is common to etch a part of a circuit using a focused ion beam system to expose a cross section of the various layers of the circuit. If the etched wall is curved or not perpendicular to the surface, a cross sectional view of the exposed surface will be distorted. To maximize resolution of the imaged cross section, the etching is preferably straight down, perpendicular to the surface of the wafer on which the integrated circuit is formed.

Figure 8A:
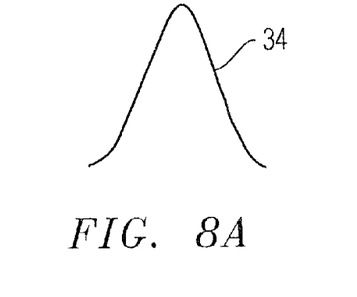
FIG. 8A shows a non-uniform current distribution of a focused ion beam.
Figure 8B:
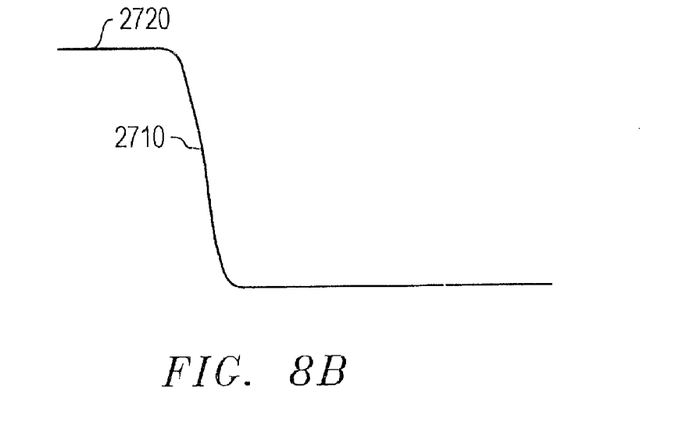
FIG. 8B shows an area etched by a focused ion beam oriented perpendicular to work piece surface and having the current distribution shown in FIG. 8A.
Figure 8C:
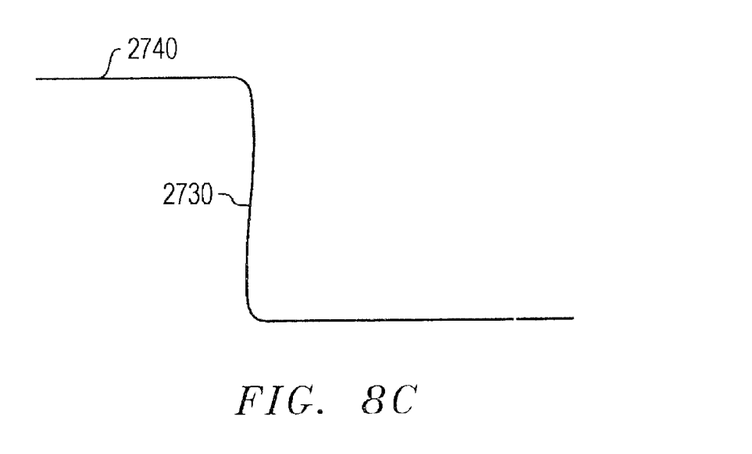
FIG. 8C shows an area etched by a focused ion beam tiled approximately five degrees from the vertical and having the current distribution shown in FIG. 8A.

Because the current distribution across the focused ion beam in not uniform, a vertical focused ion beam does not etch an edge that is perpendicular to the surface. FIG. 8A shows a graph of the intensity distribution 2705 of a focused ion beam, showing that the ion current does not fall instantly to zero, but trails off at the edge of the beam. FIG. 8B shows a typical wall 2710 of a cross section etched by a focused ion beam having the intensity distribution shown in FIG. 8A. Wall 2710 is not A perpendicular to a wafer surface 2720. By etching using a tilted focused ion beam, preferably tilted about 4 degrees from the vertical, the etched wall can be made vertical. FIG. 8C shows a typical wall 2730 etched using a tilted focused ion beam. Wall 2730 is approximately perpendicular to a wafer surface 2740.

Thus, tilting a charged particle beam column provides a method for producing an etched wall that is approximately perpendicular to a work piece surface so that a high-resolution image of the exposed wall be obtained. Although the same effect could be accomplished by tilting the stage, tilting stages have several disadvantages as described in U.S. Pat. No. 6,039,000, "Focused Particle Beam System and Methods Using a Tilt Column," which is assigned to the assignee of the present application.

Figure 9:
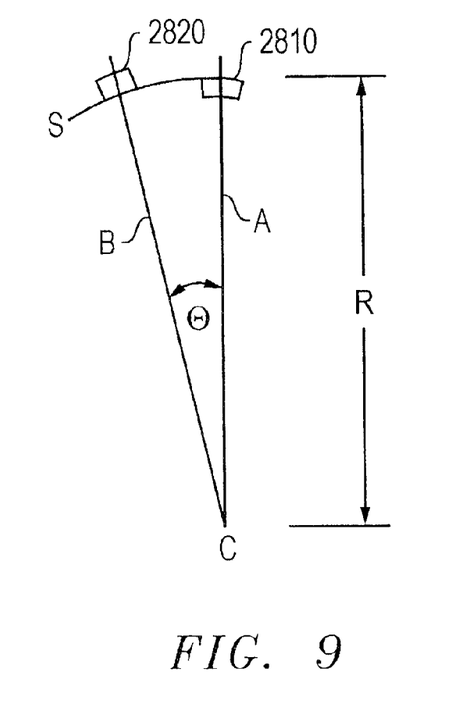
FIG. 9 is an illustration of a tilt geometry.

The geometry of motion provided by the above-described system is illustrated in FIG. 9. A reference axis A passes through a first subassembly 2810 that is fixed with respect to the reference axis. A tilt axis B passes through a second assembly 2820 to which the beam column is mounted and is coincident with the beam axis of the column. Second subassembly 2820 is fixed with respect to the tilt axis but may move with respect to first subassembly 2810 through a path of spatial displacement, S. Tilt axis B may coincide with reference axis A or may rotate about an axis of rotation C perpendicular to A and B to form an angle of displacement, $\theta$. To the extent that the radius of curvature R is constant with respect to $\theta$, the path of spatial displacement, S is a circular arc. This causes the beam to pass through a point that remains substantially unchanged with respect to the first subassembly during spatial displacement of the beam column, thereby enabling the system to maintain a substantially constant eucentric point for all angles of tilt. This angular displacement is achieved by the preferred embodiment of the present invention described above. Moreover, it is achieved with minimal vibration for a continuous range of tilt angles without interruption of system operation.

As noted above, motor 2220 is controlled by electrical signals that correspond to a desired angular displacement of the beam column. Thus, while the beam system is in operation, the angular displacement of the beam column can be adjusted by a controlled changed in the electrical signals driving motor 2220. Motor 2220 and associated electrical signals can be implemented to continuously—or in steps, in the case of a stepping motor—drive the moveable subassembly electro-mechanically through a desired angular displacement from its current position or to a particular desired angle of tilt.

A desired sequence of angular displacements through which the column is tilted during an interval of time can be implemented in software to program a microprocessor, or other programmable machine, to cause electronic circuitry within a motor control subsystem to generate the electrical signals required to drive the column through the desired sequence. A user of the system can program the sequence by way of an information display apparatus and an information entry apparatus such as, for example, a video monitor and keyboard.

The system user controls the tilt of the column by entering information through a keyboard that can be displayed on a video monitor, and transmitted to a computer. The computer can be caused by information transmitted to it to initiate a sequence of outputs that cause the motor control subsystem to generate signals that drive subassembly 2200 through a desired sequence of angular displacements.

The beam column of the system is mounted to subassembly 2200 in an orientation that aligns the axis of the beam emitted by the beam column with the tilt axis of subassembly 2200. The emitted beam therefore passes through an interior region of the chamber to impact the work piece affixed to the work station in the chamber at the currently desired angle of incidence. Embeddable in the computer is a software program that enables control of, not only tilt angle, but also the rate at which angular displacement occurs. The computer be programmed to control the dwell time at a fixed angle of tilt between successive changes in tilt angle.

Further, the computer can be programmed to control movement and rate of movement of the work station. Thus, control of the relative orientation and relative rate of motion between the work station and the beam of the beam column is provided. Additionally, the emission of the beam can be caused to cease for a controllable and specifiable interval of time. Therefore, the beam can be "turned off" if desired when, for example, relative motion between the beam column and the work station occurs.

The system of the present invention may further comprise an imaging subsystem comprising an imaging beam source and a detector. The imaging beam source and detector are disposed at such angles and distances with respect to the work station as to enable imaging of the work piece, without interfering with the beam emitted by the beam column. In an alternative embodiment, the imaging beam source may be the beam column mounted to subassembly 2200 to enable imaging at selectable desired tilt angles. A detector generates signals in response to emissions received from the work piece. These signals may then be processed and sent to a video monitor to display an image of the work piece.

Thus, the present invention provides an automate-able electro-mechanical drive system to drive a beam column through a pre-determinable sequence of displacements. Although the present invention and its advantages have been described in detail, it should be understood that various changes, substitutions and alterations can be made herein without departing from the spirit and scope of the invention as defined by the appended claims. For example, and without limitation, persons of ordinary skill in the art will readily see that the electro-mechanical drive system described herein could also include hydraulic elements. A linear motor could be used in substitution of the rotary motor described above. A mechanically activated disconnect switch could be used instead of or in addition to the sensors employed to limit the extent of displacement of the apparatus.

The invention achieves multiple objectives and because the invention can be used in different applications for different purposes, not every embodiment falling within the scope of the attached claims will achieve every objective. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim as follows:

1. A method for moving a beam column of a beam system through an interval of angular displacement, comprising the steps of:
    providing a first subassembly affixed to a vacuum chamber and having a first opening;
    providing a second subassembly to which a beam column is affixed, the second subassembly having a second opening and being electro-mechanically drive-able through a path of angular displacement with respect lo the first subassembly; and
    providing a vacuum seal between the first opening and the second opening.

2. The method of claim 1, wherein a beam of the beam column passes through a point that remains substantially fixed with respect to the first subassembly throughout a range of angular displacement.

3. The method of claim 1, wherein the path of angular displacement is a circular arc.

4. The method of claim 1, wherein during angular displacement a gas seal is maintainable between a first region that includes a beam of the beam column and a second region that excludes the beam.

5. The method of claim 1, further comprising the steps of:
    providing a motor mounted to one of the two subassemblies with a first gear mounted to a rotatable shaft of the motor; and
    providing a second gear enmeshed with the first gear and mounted to the opposite subassembly to which the motor is mounted; whereby rotation of the shaft causes relative motion between the subassemblies.

6. The method of claim 1, wherein the second subassembly to which the beam column is affixed is electro-mechanically drive-able through a sequence of incremental steps of spatial displacement with respect to the first subassembly.

7. The method of claim 1, further comprising the steps of:
    providing a mechanism to limit the extent of displacement.

8. The method of claim 1, further comprising the steps of:
    providing an air bearing between conformal opposing surfaces of the two subassemblies.

9. The method of claim 1 in which providing a second subassembly to which the beam column is affixed includes affixing a beam column having one end extending outside a vacuum chamber and further comprising providing a drive mechanism outside of the vacuum chamber for driving the second assembly.

10. An apparatus for moving a beam column of a beam system through a path of angular displacement, comprising:
    a first subassembly affixed to a vacuum chamber and having a first opening;
    a second subassembly to which the beam column is mounted, the second assembly having a second opening:
    an electro-mechanical drive system to electro-mechanically drive the second subassembly through a path of angular displacement with respect to a position of the first subassembly; and
    a vacuum seal between the first opening and the second opening.

11. The apparatus of claim 10 in which one end of the beam column extends outside the vacuum chamber and one end of the beam column extends inside the vacuum chamber.

12. The apparatus of claim 10, wherein a beam of the beam column passes through a point that remains substantially fixed with respect to the first subassembly throughout a range of angular displacement.

13. The apparatus of claim 10, wherein during the angular displacement the vacuum seal maintains a gas-tight seal between a first region that includes a beam of the beam column and a second region that excludes the beam.

14. The apparatus of claim 10, in which the vacuum seal includes a bellows apparatus.

15. The apparatus of claim 10, wherein the electro-mechanical drive system further comprises:
    a motor mounted to one of the two subassemblies with a first gear mounted to a rotatable shaft of the motor; and
    a second gear enmeshed with the first gear and mounted to the opposite subassembly to which the motor is mounted; whereby rotation of the shaft causes relative motion between the subassemblies.

16. The apparatus of claim 15, wherein the motor is controllable to drive the beam column through a sequence of incremental steps of spatial displacement.

17. The apparatus of claim 10, further comprising:
    a mechanism to limit the extent of displacement.

18. The apparatus of claim 17, wherein the mechanism further comprises a sensor to detect an extent of displacement.

19. The apparatus of claim 10, further comprising:
    an air bearing between conformal opposing surfaces of the two subassemblies.

20. A beam system for interacting with a work piece, comprising:
    a first subassembly affixed to a vacuum chamber and having a first opening;
    a second subassembly to which the beam column is mounted, the second assembly having a second opening;
    an electro-mechanical drive system to electro-mechanically drive the second subassembly through a path of angular displacement with respect to a position of the first subassembly;
    a vacuum seal between the first opening and the second opening and
    a beam column mounted to the second subassembly for generating a beam to interact with the work piece.

21. The system of claim 20, wherein during the displacement a gas seal is maintainable between a first region that includes the beam and a second region that excludes the beam.

22. The system of claim 20, wherein the beam column is drive-able through a pre-determinable sequence of angular displacements.

23. The system of claim 20, further comprising a processor for controlling the rate of angular displacement of the beam column.

* * * * *